(12) United States Patent
Chen

(10) Patent No.: US 10,594,302 B1
(45) Date of Patent: Mar. 17, 2020

(54) VOLTAGE DETECTION SYSTEM

(71) Applicant: Yangtze Memory Technologies Co., Ltd., Wuhan, Hubei Province (CN)

(72) Inventor: Weirong Chen, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/151,305

(22) Filed: Oct. 3, 2018

Related U.S. Application Data

(63) Continuation of application No. PCT/CN2018/106957, filed on Sep. 21, 2018.

(51) Int. Cl.
| | |
|---|---|
| *H03K 3/02* | (2006.01) |
| *G11C 16/30* | (2006.01) |
| *G01R 19/165* | (2006.01) |
| *G06F 1/3234* | (2019.01) |
| *G06F 1/3296* | (2019.01) |
| *G11C 5/14* | (2006.01) |

(52) U.S. Cl.
CPC ......... *H03K 3/02* (2013.01); *G01R 19/16552* (2013.01); *G06F 1/3275* (2013.01); *G06F 1/3296* (2013.01); *G11C 16/30* (2013.01); *G11C 5/147* (2013.01)

(58) Field of Classification Search
CPC ....... G11C 16/30; G11C 5/147; G06F 1/3296; G06F 1/3275; G01R 19/16552
See application file for complete search history.

(56) References Cited

U.S. PATENT DOCUMENTS

| | | | |
|---|---|---|---|
| 6,222,398 B1 | 4/2001 | Kondo | |
| 9,036,445 B1* | 5/2015 | Shin | G11C 29/785 365/200 |
| 9,985,519 B2 | 5/2018 | Suzuki | |
| 10,021,242 B1 | 7/2018 | Liang | |
| 2003/0223271 A1* | 12/2003 | Byeon | G11C 5/147 365/185.18 |
| 2005/0140405 A1 | 6/2005 | Do | |
| 2007/0195475 A1* | 8/2007 | Suzuki | H03K 17/223 361/92 |
| 2010/0164565 A1* | 7/2010 | Takeuchi | H03K 17/223 327/143 |
| 2012/0092046 A1 | 4/2012 | Li | |

FOREIGN PATENT DOCUMENTS

| | | |
|---|---|---|
| CN | 101369399 A | 2/2009 |
| CN | 107329879 A | 11/2017 |
| EP | 2509224 A2 | 10/2012 |
| JP | 2000-356655 A | 12/2000 |
| TW | 201029301 A1 | 8/2010 |
| TW | 201223101 A1 | 6/2012 |

* cited by examiner

*Primary Examiner* — Ajay Ojha
(74) *Attorney, Agent, or Firm* — Winston Hsu

(57) ABSTRACT

A voltage detection system includes a first voltage detector and a second voltage detector. The first voltage detector is configured for detecting whether an input voltage reaches a first voltage level. The second voltage detector, coupled to the first voltage detector, is configured for detecting whether the input voltage reaches a second voltage level. The first voltage detector outputs a control signal to control a status of the second voltage detector according to a detection result of the first voltage detector.

16 Claims, 3 Drawing Sheets

VOLTAGE DETECTION SYSTEM

CROSS REFERENCE TO RELATED APPLICATIONS

The present application is a continuation application of International Application No. PCT/CN2018/106957, filed on Sep. 21, 2018. The present application is based on and claims priority to International Application No. PCT/CN2018/106957, filed on Sep. 21, 2018, the contents of which are incorporated herein by reference in its entirety.

BACKGROUND OF THE INVENTION

1. Field of the Invention

The present invention relates to a voltage detection system, and more particularly, to a flexible scheme applicable to a voltage detection system.

2. Description of the Prior Art

In an electronic system, each module is required to receive a predetermined power supply voltage to operate normally, and a voltage detector is applied to determine whether the power supply voltage reaches its target level. For example, in an NAND flash system with a flash controller, the logic circuit in the flash controller may operate normally if the power supply voltage reaches 1.6V, so there may be a voltage detector for determining whether the power supply voltage reaches 1.6V and enabling the functional modules of the logic circuit when the power supply voltage reaches 1.6V. The NAND flash may operate normally if the power supply voltage reaches 2.0V, so there may be a voltage detector for determining whether the power supply voltage reaches 2.0V. In addition, the NAND flash may perform a soft start procedure if the power supply voltage rises above 1.8V, and/or perform a soft shutdown procedure if the power supply voltage drops below 1.8V; hence, there may be a voltage detector for determining whether the power supply voltage reaches 1.8V.

In such a situation, several voltage detectors for different voltages 1.6V, 1.8V and 2.0V are necessary to control the behaviors of the flash memory and its control circuit in the NAND flash system. These voltage detectors all detect the power supply voltage provided for the NAND flash system from an external voltage source. These voltage detectors are always on and consume a great amount of power. Thus, there is a need for improvement over the prior art.

SUMMARY OF THE INVENTION

It is therefore an objective of the present invention to provide a novel voltage detection system where a voltage detector for a first voltage level may control another voltage detector for a second voltage level to be turned off, in order to save power consumption.

An embodiment of the present invention discloses a voltage detection system, which comprises a first voltage detector and a second voltage detector. The first voltage detector is configured for detecting whether an input voltage reaches a first voltage level. The second voltage detector, coupled to the first voltage detector, is configured for detecting whether the input voltage reaches a second voltage level. The first voltage detector outputs a control signal to control a status of the second voltage detector according to a detection result of the first voltage detector.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
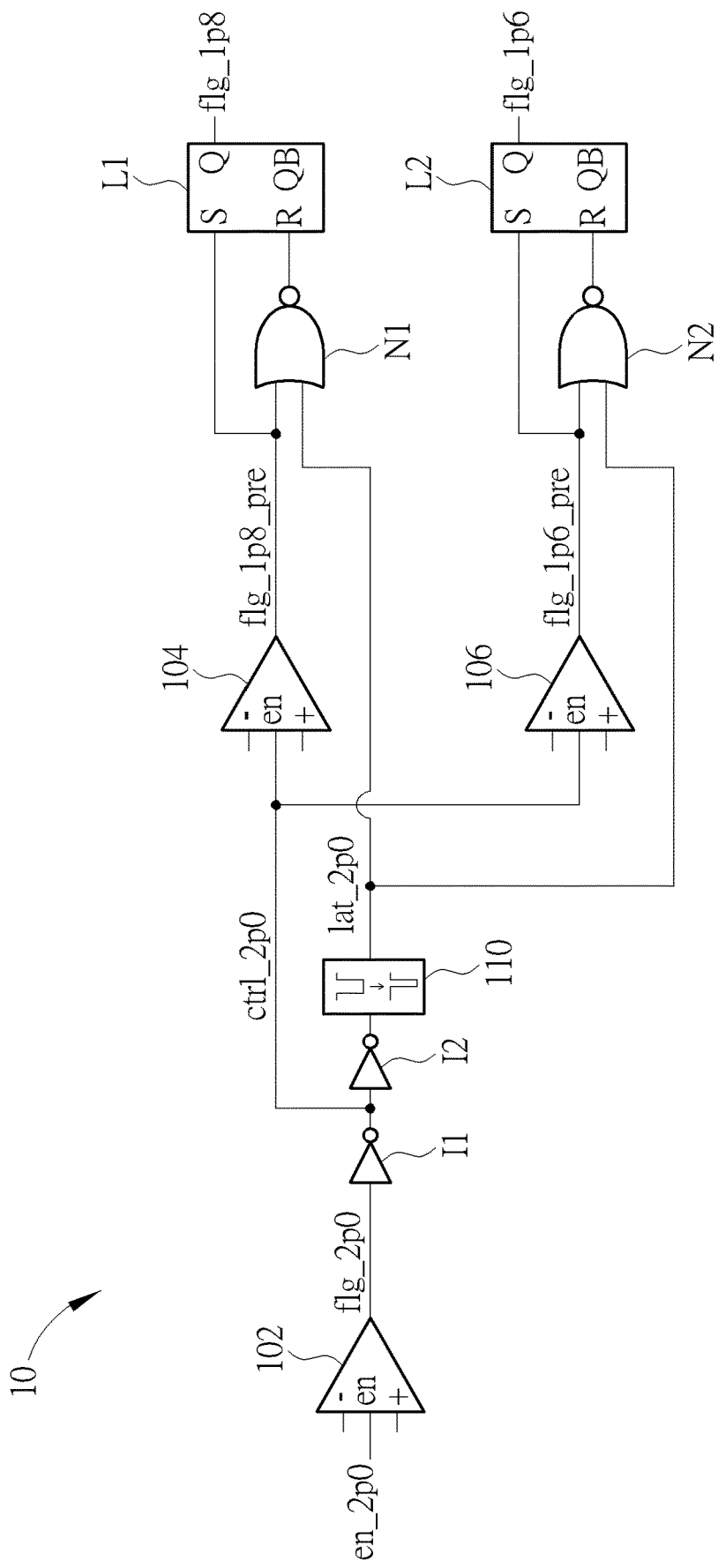
FIG. 1 is a schematic diagram of a voltage detection system according to an embodiment of the present invention.

As mentioned above, the NAND flash system requires at least three voltage detectors for the same power supply voltage, and the three voltage detectors target 1.6V, 1.8V and 2.0V, respectively. It should be noted that when the NAND flash operates normally, the power supply voltage may exceed 2.0V. In such a situation, the power supply voltage should also be greater than 1.8V and 1.6V. This power supply voltage cannot cross 2.0V, 1.8V and 1.6V at the same time. Therefore, if the 2.0V detector ensures that the power supply voltage is above 2.0V, the 1.8V detector and the 1.6V detector may be turned off without affecting the voltage detection effects of the system. More specifically, when the 2.0V detector detects that the power supply voltage exceeds 2.0V, it may send a control signal to turn off the 1.8V detector and the 1.6V detector, and also send a latch signal to latch the outputs of the 1.8V detector and the 1.6V detector. When the 2.0V detector detects that the power supply voltage falls below 2.0V, it may turn on the 1.8V detector and the 1.6V detector, and also release the outputs of the 1.8V detector and the 1.6V detector.

Please refer to FIG. 1, which is a schematic diagram of a voltage detection system 10 according to an embodiment of the present invention. As shown in FIG. 1, the voltage detection system 10 includes three voltage detectors 102, 104 and 106, a delay circuit 110, two SR latches L1 and L2, two inverters I1 and I2, and two NOR gates N1 and N2. The voltage detectors 102-106 are configured to detect whether an input voltage reaches different voltage levels. In this embodiment, the voltage detector 102 targets 2.0V, the voltage detector 104 targets 1.8V and the voltage detector 106 targets 1.6V. Each of the voltage detectors 102-106 may be implemented as a comparator, which outputs a flag signal in response to the comparison result between two voltages respectively received by the positive input terminal and the negative input terminal of the comparator.

Figure 2:
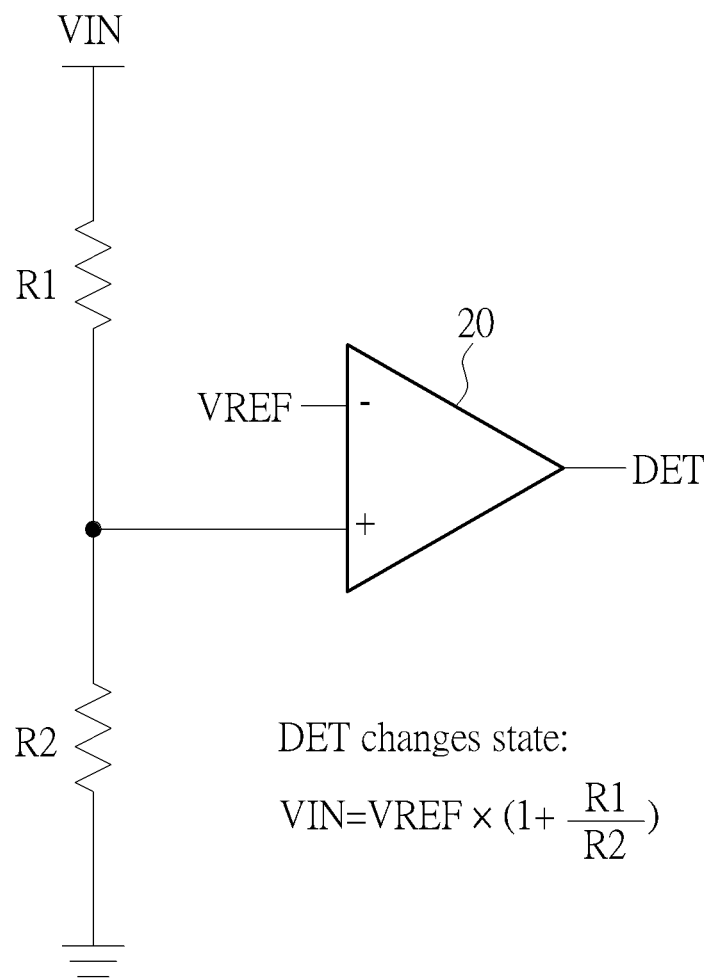
FIG. 2 is a schematic diagram of a voltage detector comparing an input voltage with a reference voltage to generate a detection result.

Each voltage detector 102-106 may compare the input voltage with a corresponding level by any method. In an exemplary embodiment, the positive input terminal of the voltage detector is coupled to the input voltage via a resistor ladder, and the negative input terminal of the voltage detector receives a reference voltage such as the bandgap reference voltage of the system or a voltage level generated from the bandgap reference voltage. Please refer to FIG. 2, which is a schematic diagram of a voltage detector 20 comparing an input voltage VIN with a reference voltage VREF to generate a detection result DET. The resistor ladder includes resistors R1 and R2, each of which may be a single resistor or combination of multiple resistors or may be composed of any other devices having equivalent resistance. In the voltage detector 20, the detection result DET changes when the input voltage VIN is equal to the reference voltage VREF multiplied by a ratio (1+R1/R2); hence, the resistors R1 and R2 may be configured to allow the detection result DET to change state when the input voltage VIN reaches a target level equal to VREF×(1+R1/R2). As for the voltage detectors 102, 104 and 106, the resistors R1 and R2 are configured to make the values of VREF×(1+R1/R2) equal to 2.0V, 1.8V and 1.6V, respectively. In an embodiment, the resistor ladder for the voltage detectors 102, 104 and 106 may have a similar structure, and the tap point in the resistor ladder connected to the positive input terminal of the voltage detector is selected to realize the target comparison level of the input voltage VIN. With the above comparison scheme, the voltage detector 102 may generate a flag signal flg_2p0, the voltage detector 104 may generate a flag signal flg_1p8_pre, and the voltage detector 106 may generate a flag signal flg_1p6_pre. The above voltages inputted to the input terminals of the voltage detectors 102-106 are omitted in FIG. 1 for brevity, and those skilled in the art may refer to FIG. 2 for detailed implementation of the connection methods of the voltage detectors 102-106.

Please note that the voltage detectors 102-106 are configured to detect the same input voltage which may be a power supply voltage from a power source. Since the power supply voltage cannot cross 1.6V, 1.8V and 2.0V at the same time, the voltage detector 102 may output a control signal ctrl_2p0 to control the status of the voltage detectors 104 and 106, i.e., to control the voltage detectors 104 and 106 to be turned on or off, according to the detection result of the voltage detector 102. In detail, when the detection result of the voltage detector 102 indicates that the power supply voltage is greater than 2.0V, voltage detections for 1.8V and 1.6V are not necessary; hence, the voltage detector 102 outputs the control signal ctrl_2p0 to turn off the voltage detectors 104 and 106. When the detection result indicates that the power supply voltage is smaller than 2.0V, voltage detections for 1.8V and 1.6V are required; hence, the voltage detector outputs the control signal ctrl_2p0 to turn on the voltage detectors 104 and 106. In this embodiment, the voltage detector 102 outputs the flag signal flg_2p0 as the detection result, and the inverter I1 converts the flag signal flg_2p0 to generate the control signal ctrl_2p0, which is outputted to the enable pin (en) of the voltage detectors 104 and 106, to turn the voltage detectors 104 and 106 on or off. Note that the enable pin (en) of the voltage detector 102 receives an external enable signal en_2p0. The external enable signal en_2p0 may indicate that a bandgap reference voltage of the system reaches its target voltage so that the reference voltage for the voltage detector 102 is ready.

When the power supply voltage is greater than 2.0V, the voltage detectors 104 and 106 are turned off or disabled. In such a situation, the output signals flg_1p8 and flg_1p6 of the voltage detectors 104 and 106 should be latched to indicate that the power supply voltage remains above 1.8V and 1.6V. The SR latches L1-L2 and the NOR gates N1-N2 are implemented to latch the output signals flg_1p8 and flg_1p6 of the voltage detectors 104 and 106. In detail, the SR latch L1 is coupled to the voltage detectors 102 and 104, for generating the output signal flg_1p8 of the voltage detector 104 by receiving the latch signal lat_2p0 from the voltage detector 102 and the flag signal flg_1p8_pre from the voltage detector 104. The output signal flg_1p8 may also be considered as a flag signal which is determined by the flag signal flg_1p8_pre from the voltage detector 104 when the voltage detector 104 is turned on and latched by the latch signal lat_2p0 when the voltage detector 104 is turned off. Similarly, the SR latch L2 is coupled to the voltage detectors 102 and 106, for generating the output signal flg_1p6 of the voltage detector 106 by receiving the latch signal lat_2p0 from the voltage detector 102 and the flag signal flg_1p6_pre from the voltage detector 106. The output signal flg_1p6 may also be considered as a flag signal which is determined by the flag signal flg_1p6_pre from the voltage detector 106 when the voltage detector 106 is turned on and latched by the latch signal lat_2p0 when the voltage detector 106 is turned off.

As shown in FIG. 1, the voltage detection system 10 further includes a delay circuit 110, which is coupled to the voltage detector 102 via the inverters I1 and I2. The delay circuit 110 delays the flag signal flg_2p0 to generate the latch signal lat_2p0, which is transmitted to the SR latches L1 and L2 (via the NOR gates N1 and N2, respectively) to latch the output signals flg_1p8 and flg_1p6 when the voltage detectors 104 and 106 are turned off. In an embodiment, the delay circuit 110 generates a delay at the falling edge of the flag signal flg_2p0, where the falling edge is triggered by falling of the input voltage. The falling edge delay prevents the SR latches L1 and L2 from being released before the voltage detectors 104 and 106 are turned on, so as to prevent a potential glitch on the output signals flg_1p8 and flg_1p6 when the input signal falls across 2.0V to trigger the flag signal flg_2p0 to change state.

Figure 3:
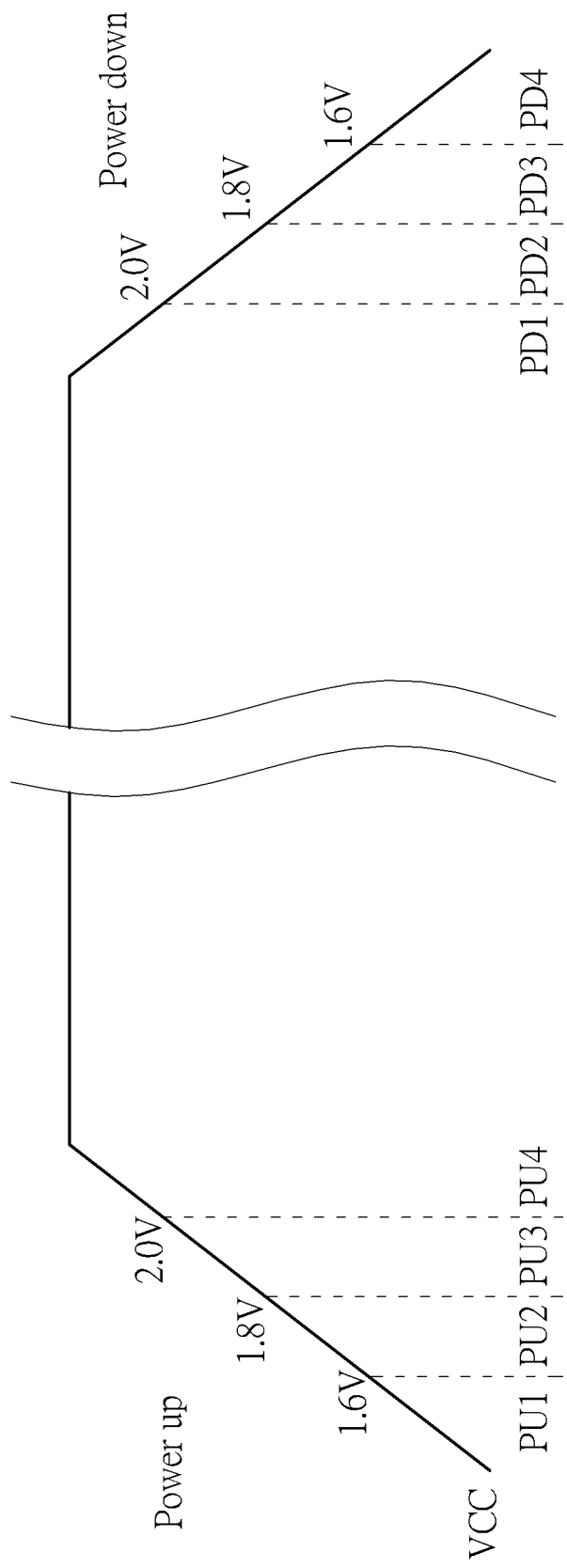
FIG. 3 is a waveform diagram of a power supply voltage during power up sequence and power down sequence according to an embodiment of the present invention.

Please refer to FIG. 3, which is a waveform diagram of a power supply voltage VCC during power up sequence and power down sequence according to an embodiment of the present invention. As shown in FIG. 3, the power supply voltage VCC may undergo power up during the periods PU1-PU4 and undergo power down during the periods PD1-PD4. Suppose that each voltage detector 102, 104 or 106 receives the power supply voltage VCC via a resistor ladder connected to the positive input terminal and receives the reference voltage via the negative input terminal; hence, the flag signal outputted by each of the voltage detectors 102, 104 and 106 may be "1" if the power supply voltage VCC is greater than the corresponding target voltage 2.0V, 1.8V or 1.6V and may be "0" if the power supply voltage VCC is smaller than the corresponding target voltage. Note that during the power up sequence where the power supply voltage VCC is rising, the voltage detector 106 (for 1.6V) is triggered first, then the voltage detector 104 (for 1.8V) is triggered, and then the voltage detector 102 (for 2.0V); and during the power down sequence where the power supply voltage is falling, the voltage detector 102 (for 2.0V) is triggered first, then the voltage detector 104 (for 1.8V) is triggered, and then the voltage detector 106 (for 1.6V).

In the period PU1, the power supply voltage VCC is lower than 1.6V, and thus the flag signal flg_2p0 is "0". The control signal ctrl_2p0, which is "1" after conversion of the inverter I1, may turn on the voltage detectors 104 and 106 to enable their voltage detection functions. The flag signals flg_1p8_pre and flg_1p6_pre of the voltage detectors 104 and 106 are thereby outputted as "0". In addition, the latch signal lat_2p0 is "0" after conversions of the inverters I1 and I2, so that the NOR gate N1 outputs "1" to reset the SR latch L1, and the NOR gate N2 outputs "1" to reset the SR latch L2; hence, both the output signals flg_1p8 and flg_1p6 are "0".

In the period PU2, the power supply voltage VCC is between 1.6V and 1.8V, and thus the flag signal flg_2p0 remains at "0". The control signal ctrl_2p0 remains at "1", so that the voltage detection functions of the voltage detectors 104 and 106 are still enabled. The latch signal lat_2p0 remains at "0" and the flag signal flg_1p8_pre of the voltage detector 104 is still "0", so that the NOR gate N1 outputs "1" to reset the SR latch L1; hence, the output signal flg_1p8 is "0". The flag signal flg_1p6_pre of the voltage detector 106 becomes "1", and thus the reset terminal of the SR latch L2 transits to "0" to release the output of the SR latch L2. In such a situation, the flag signal flg_1p6_pre thereby sets the SR latch L2 to output the output signal flg_1p6 as "1".

In the period PU3, the power supply voltage VCC is between 1.8V and 2.0V, and thus the flag signal flg_2p0 remains at "0". The control signal ctrl_2p0 remains at "1", so that the voltage detection functions of the voltage detectors 104 and 106 are still enabled. The flag signal flg_1p6_pre and the output signal flg_1p6 of the voltage detector 106 remain at "1". The flag signal flg_1p8_pre of the voltage detector 104 becomes "1", and thus the reset terminal of the SR latch L1 transits to "0" to release the output of the SR latch L1. In such a situation, the flag signal flg_1p8_pre thereby sets the SR latch L1 to output the output signal flg_1p8 as "1".

In the period PU4, the power supply voltage VCC rises above 2.0V and enters the normal operation range of the system. The flag signal flg_2p0 becomes "1", and the control signal ctrl_2p0 becomes "0" accordingly, to turn off the voltage detectors 104 and 106. In addition, the latch signal lat_2p0 becomes "1", which results in that the NOR gates N1 and N2 output "0" to force the output signals flg_1p8 and flg_1p6 to be latched at "1". Therefore, during the normal operation period where the power supply voltage VCC is greater than 2.0V, the voltage detectors 104 and 106 may be turned off or disabled, so as to reduce power consumption. More specifically, parts of the power consumption contributed by the voltage detectors 104 and 106 may be eliminated.

The detailed operations of the power down sequence are illustrated below. In the period PD1, the power supply voltage VCC is greater than 2.0V, and the operations are similar to those in the period PU4 and thus omitted herein. In the period PD2, the power supply voltage VCC falls below 2.0V to be between 1.8V and 2.0V, so that the flag signal flg_2p0 becomes "0" and the control signal ctrl_2p0 becomes "1" to turn on the voltage detectors 104 and 106. The voltage detector 104 detects that the power supply voltage VCC is greater than 1.8V and outputs the flag signal flg_1p8_pre as "1", and the voltage detector 106 detects that the power supply voltage VCC is greater than 1.6V and outputs the flag signal flg_1p6_pre as "1". The output signals flg_1p8 and flg_1p6 remain at "1" due to controls of the flag signals flg_1p8_pre and flg_1p6_pre.

Please note that when the power supply voltage VCC falls across 2.0V, the flag signal flg_2p0 changes state, and the output signals of the SR latches L1 and L2 are released while the voltage detectors 104 and 106 start to operate and output the flag signals flg_108_pre and flg_106_pre to control the SR latches L1 and L2. When the flag signal flg_2p0 changes state, it requires extremely short time to convert the flag signal flg_2p0 to control the SR latches L1 and L2 to release their output signals flg_1p8 and flg_1p6 since the signals pass through simple logic gates. At this moment, the control signal ctrl_2p0 turns on the voltage detectors 104 and 106 and the voltage detectors 104 and 106 may generate the flag signals flg_1p8_pre and flg_1p6_pre after a turned-on time and a processing time. Therefore, the delay circuit 110 is disposed on the signal path of the latch signal lat_2p0, to let the latch signal lat_2p0 to change state after the voltage detectors 104 and 106 are ready to output the flag signals flg_1p8_pre and flg_1p6_pre. This prevents a glitch generated on the output signals flg_1p8 and/or flg_1p6. In this embodiment, the delay circuit 110 generates a falling edge delay, which delays the flag signal flg_2p0 to generate a delayed latch signal lat_2p0 when the power supply voltage VCC falls.

In the period PD3, the power supply voltage VCC falls below 1.8V to be between 1.6V and 1.8V, and thus the flag signal flg_2p0 is "0". The control signal ctrl_2p0 remains at "1", so that the voltage detection functions of the voltage detectors 104 and 106 are still enabled. The flag signal flg_1p8_pre becomes "0", so that the NOR gate N1 outputs "1" and the output signal flg_1p8 is reset to "0". The flag signal flg_1p6_pre remains at "1", and thus the output signal flg_1p6 also remains at "1".

In the period PD4, the power supply voltage VCC falls below 1.6V, and thus the flag signal flg_2p0 is "0". The control signal ctrl_2p0 remains at "1", so that the voltage detection functions of the voltage detectors 104 and 106 are still enabled. Both the flag signals flg_1p8_pre and flg_1p6_pre are "0", and the NOR gates N1 and N2 output "1" to the SR latches L1 and L2, respectively; hence, both the output signals flg_1p8 and flg_1p6 are "0".

Please note that the present invention aims at providing a flexible scheme applicable to a voltage detection system with multiple voltage detectors, where a first voltage detector for a higher voltage may control a second voltage detector for a lower voltage to be turned off in order to save power consumption. Those skilled in the art may make modifications and alternations accordingly. For example, the implementation shown in FIG. 1 is one of various embodiments of the present invention. In another embodiment, the control scheme may be performed in other manners, e.g., the output signal flg_1p8 of the voltage detector 104 may be configured to control the voltage detector 106 to be turned off when the power supply voltage VCC is greater than 1.8V. Alternatively, the output signal flg_1p6 of the voltage detector 106 may be configured to turn on or turn off the voltage detectors 102 and 104, to enable or disable their voltage detection functions in suitable time. In another embodiment, there may be only two voltage detectors in the system, and the determination result or output signal of one voltage detector is configured to control another one. In a further embodiment, there may be more than three voltage detectors configured with flexible control schemes. Note that the voltage values such as 2.0V, 1.8V and 1.6V specified in the above embodiments are merely intended to serve as examples, and those skilled in the art should realize that other possible voltage values are also feasible for the voltage detectors of the present invention. Furthermore, the voltage detection system of the present invention is applicable to a NAND flash system or any other type of electronic system.

To sum up, the present invention provides a voltage detection system which includes at least two voltage detectors for detecting the same input voltage. The first voltage detector may output a control signal to control the status of the second voltage detector, e.g., to turn on or off the second voltage detector, according to the detection result of the first voltage detector. For example, the first voltage detector targets a first voltage level and the second voltage detector targets a second voltage level lower than the first voltage level, and the first voltage detector may turn off the second voltage detector if the first voltage detector detects that the input voltage is greater than the first voltage level, since voltage detection regarding a lower level is not necessary when the input voltage remains at a higher level. In such a situation, power consumption contributed by the second voltage detector may be eliminated, which reduces the entire power consumption of the voltage detection system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage detection system, comprising:
   a first voltage detector, for detecting whether an input voltage reaches a first voltage level;
   a second voltage detector, coupled to the first voltage detector, for detecting whether the input voltage reaches a second voltage level; and
   a third voltage detector, for detecting whether the input voltage reaches a third voltage level, wherein the third voltage level is lower than the first voltage level;
   wherein the first voltage detector outputs a control signal to control a status of the second voltage detector according to a detection result of the first voltage detector, and the control signal further controls a status of the third voltage detector.

2. The voltage detection system of claim 1, wherein the second voltage level is lower than the first voltage level.

3. The voltage detection system of claim 1, wherein the first voltage detector outputs the control signal to turn off the second voltage detector when the input voltage is greater than the first voltage level.

4. The voltage detection system of claim 1, wherein the first voltage detector outputs the control signal to turn on the second voltage detector when the input voltage is smaller than the first voltage level.

5. The voltage detection system of claim 1, wherein the first voltage detector outputs a latch signal to latch an output signal of the second voltage detector when the input voltage is greater than the first voltage level.

6. The voltage detection system of claim 5, further comprising:
   a latch circuit, coupled to the first voltage detector and the second voltage detector, for generating the output signal of the second voltage detector by receiving the latch signal from the first voltage detector and a flag signal from the second voltage detector.

7. The voltage detection system of claim 6, further comprising:
   a delay circuit, coupled to the first voltage detector, for delaying an output signal of the first voltage detector to generate the latch signal transmitted to the latch circuit.

8. The voltage detection system of claim 7, wherein the delay circuit delays the output signal of the first voltage detector when the output signal of the first voltage detector is triggered by falling of the input voltage.

9. The voltage detection system of claim 1, wherein the input voltage is a power supply voltage from a power source.

10. A voltage detection system, comprising:
    a first voltage detector, for detecting whether an input voltage reaches a first voltage level; and
    a second voltage detector, coupled to the first voltage detector, for detecting whether the input voltage reaches a second voltage level;
    wherein the first voltage detector outputs a latch signal to latch an output signal of the second voltage detector when the input voltage is greater than the first voltage level; and the voltage detection system further comprises:
    a latch circuit, coupled to the first voltage detector and the second voltage detector, for generating the output signal of the second voltage detector by receiving the latch signal from the first voltage detector and a flag signal from the second voltage detector; and
    a delay circuit, coupled to the first voltage detector, for delaying an output signal of the first voltage detector to generate the latch signal transmitted to the latch circuit;
    wherein the first voltage detector outputs a control signal to control a status of the second voltage detector according to a detection result of the first voltage detector.

11. The voltage detection system of claim 10, wherein the second voltage level is lower than the first voltage level.

12. The voltage detection system of claim 10, further comprising:
    a third voltage detector, for detecting whether the input voltage reaches a third voltage level, wherein the third voltage level is lower than the first voltage level;
    wherein the control signal further controls a status of the third voltage detector.

13. The voltage detection system of claim 10, wherein the first voltage detector outputs the control signal to turn off the second voltage detector when the input voltage is greater than the first voltage level.

14. The voltage detection system of claim 10, wherein the first voltage detector outputs the control signal to turn on the second voltage detector when the input voltage is smaller than the first voltage level.

15. The voltage detection system of claim 10, wherein the delay circuit delays the output signal of the first voltage detector when the output signal of the first voltage detector is triggered by falling of the input voltage.

16. The voltage detection system of claim 10, wherein the input voltage is a power supply voltage from a power source.

* * * * *